United States Patent
Koury, Jr. et al.

(10) Patent No.: US 7,628,072 B2
(45) Date of Patent: Dec. 8, 2009

(54) MEMS DEVICE AND METHOD OF REDUCING STICTION IN A MEMS DEVICE

(75) Inventors: Daniel N. Koury, Jr., Mesa, AZ (US); Andrew C. McNeil, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 560 days.

(21) Appl. No.: 11/489,789

(22) Filed: Jul. 19, 2006

(65) Prior Publication Data

US 2008/0016964 A1 Jan. 24, 2008

(51) Int. Cl.
  *G01P 15/125* (2006.01)
(52) U.S. Cl. ............... 73/514.32; 73/514.01; 73/514.16; 73/514.38
(58) Field of Classification Search ............... 73/514.32, 73/488, 506, 510, 514.01, 514.16, 514.38
See application file for complete search history.

(56) References Cited

U.S. PATENT DOCUMENTS

| | | | | |
|---|---|---|---|---|
| 4,699,006 | A * | 10/1987 | Boxenhorn | ............... 73/514.15 |
| 5,583,291 | A | 12/1996 | Gutteridge | |
| 5,646,349 | A * | 7/1997 | Twigg et al. | ............. 73/514.38 |
| 5,817,942 | A | 10/1998 | Greiff | |
| 5,834,332 | A | 11/1998 | Hierold | |
| 6,122,963 | A | 9/2000 | Hammond | |
| 6,199,874 | B1 * | 3/2001 | Galvin et al. | ............ 280/5.514 |
| 6,215,645 | B1 | 4/2001 | Li | |
| 6,223,598 | B1 | 5/2001 | Judy | |
| 6,228,275 | B1 * | 5/2001 | Koch et al. | ...................... 216/2 |
| 6,526,198 | B1 * | 2/2003 | Wu et al. | ...................... 385/18 |
| 6,535,663 | B1 * | 3/2003 | Chertkow | ..................... 385/18 |
| 6,608,268 | B1 * | 8/2003 | Goldsmith | .................. 200/181 |
| 6,734,550 | B2 * | 5/2004 | Martin et al. | ............... 257/704 |
| 6,845,670 | B1 | 1/2005 | McNeil | |
| 6,876,046 | B2 * | 4/2005 | Prophet | ..................... 257/415 |
| 6,936,492 | B2 | 8/2005 | McNeil | |
| 7,268,463 | B2 * | 9/2007 | Li et al. | ..................... 310/309 |

OTHER PUBLICATIONS

Hammond, Jonathan, et al., Internal Transducer Design for Manufacturability and Performance at Motorola, Transducers '03, The 12th International Conference on Solid State Sensors, Actuators and Microsystems, Boston, Jun. 6-12, 2003; pp. 85-90.

* cited by examiner

*Primary Examiner*—Hezron Williams
*Assistant Examiner*—Samir M Shah
(74) *Attorney, Agent, or Firm*—Ingrassia, Fisher & Lorenz, P.C.

(57) ABSTRACT

A MEMS device includes a substrate; a movable mass suspended in proximity to the substrate; and at least one suspension structure coupled to the movable mass for performing a mechanical spring function. The at least one suspension structure has portions that move in tandem when the MEMS device is subject to at least one stimulus in a sensing direction, and further includes at least one link between the portions that move in tandem.

20 Claims, 5 Drawing Sheets

MEMS DEVICE AND METHOD OF REDUCING STICTION IN A MEMS DEVICE

FIELD OF THE INVENTION

The present invention generally relates to MEMS devices and methods for reducing stiction in MEMS devices.

BACKGROUND OF THE INVENTION

Many devices and systems include a number of different types of sensors that perform various monitoring and/or control functions. Advancement in micromachining and other microfabrication processes have enabled the manufacture of a wide variety of microelectromechanical system (MEMS) devices.

A MEMS device is one type of electronic device that has a movable mass. A particular type of sensor that includes a MEMS device is an accelerometer that uses a movable mass to detect acceleration or other stimulus along a sensing direction. In a typical accelerometer, the movable mass forms part of a differential capacitor pair. The motion of the movable mass is detected by a sensing circuit coupled to the differential capacitor pair, and the acceleration of the MEMS device can thereby be calculated.

The movable mass in a typical MEMS device is suspended in proximity to a substrate with one or more suspension structures. The suspension structures can be folded to have a number of elbows to provide a space efficient design and to reduce the effects of package stresses on the MEMS device. However, portions of the suspension structures can disadvantageously touch and stick together under certain loading conditions. This situation is known as "stiction" and can cause malfunction of the MEMS device.

Accordingly, it is desirable to provide a MEMS device with a reduced occurrence of stiction. In addition, it is desirable to provide a method of reducing stiction in a MEMS device.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description is merely exemplary in nature and is not intended to limit the invention or the application and uses of the invention. Furthermore, there is no intention to be bound by any theory presented in the preceding background of the invention or the following detailed description of the invention. In this regard, although the invention is depicted and described in the context of an accelerometer, it will be appreciated that the invention could be used for any one of the numerous devices that include a movable mass suspended by suspension structures in proximity to a substrate. The MEMS device discussed herein can include a plurality of chips in a common package, for example, one chip with the movable MEMS element and a separate chip for the circuitry, or a single, integrated chip.

Figure 1:
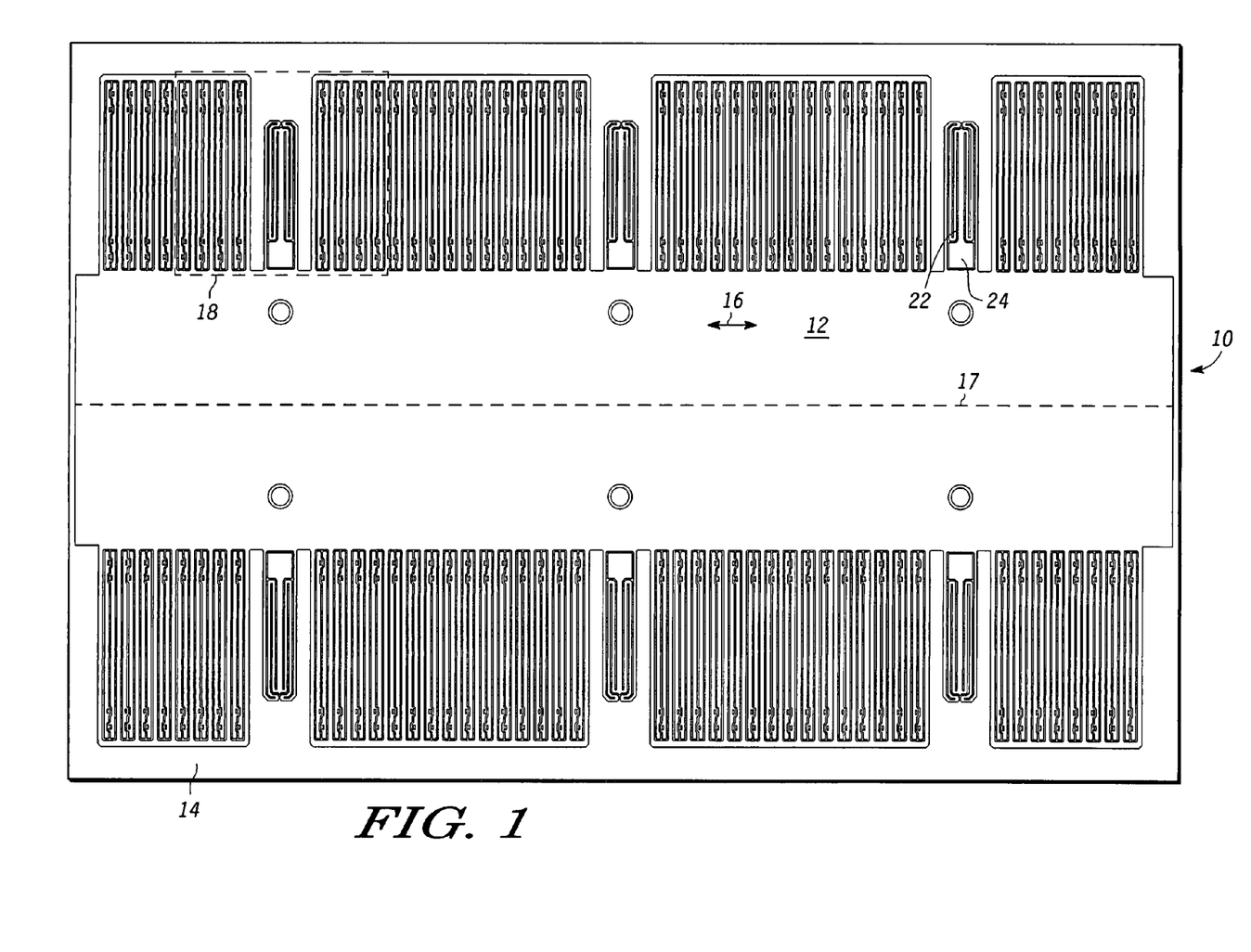
FIG. 1 illustrates a schematic, top plan view of a MEMS device of a first exemplary embodiment.
Figure 2:
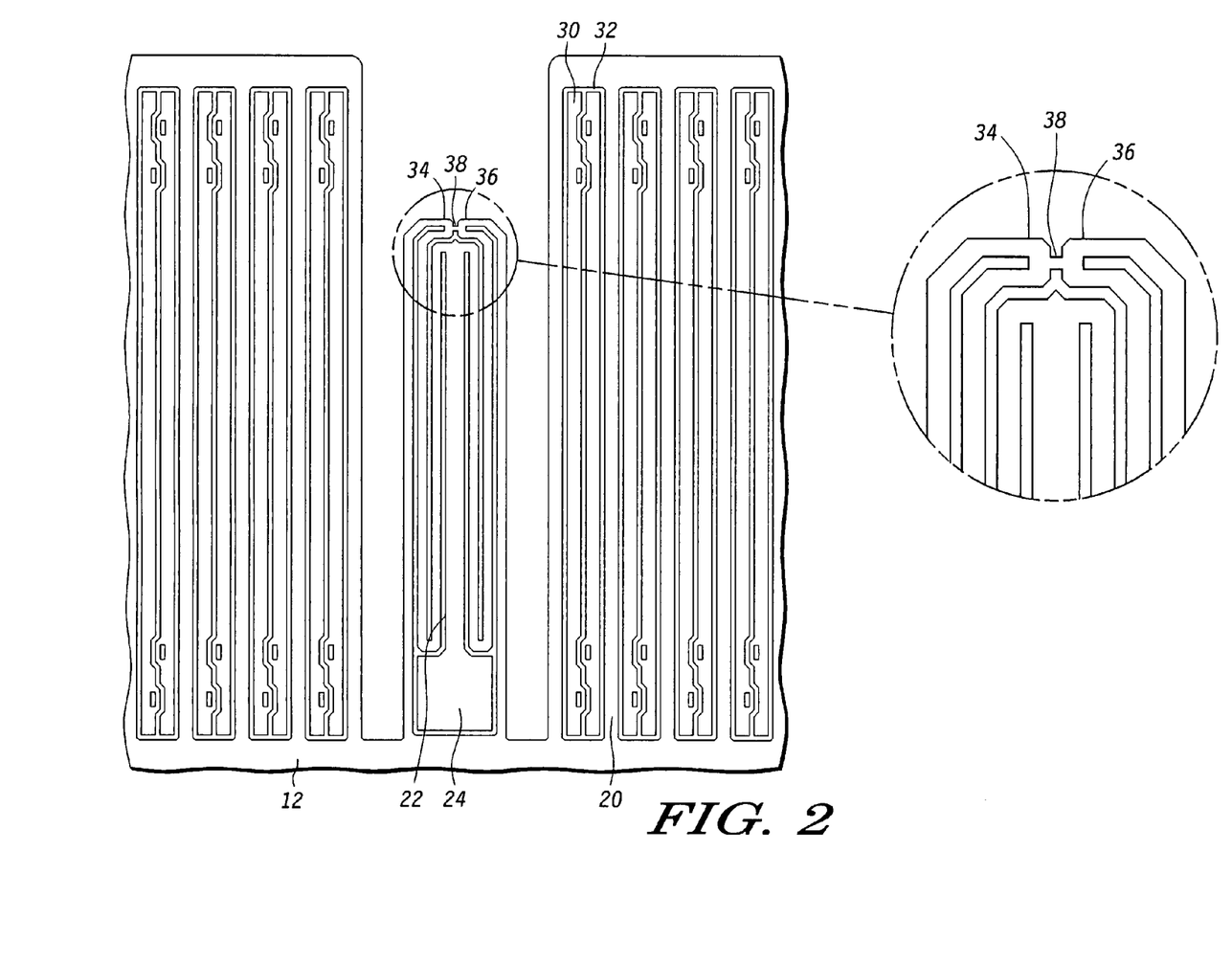
FIG. 2 illustrates a portion of the MEMS device shown in FIG. 1.

FIG. 1 is a schematic, top plan view of a MEMS device 10 according to one embodiment. In the specific embodiment described herein, the MEMS device 10 is used in an accelerometer. The MEMS device 10 has a movable mass 12 that moves in response to acceleration or other stimulus along a sensing direction in a plane substantially parallel to an underlying substrate 14. The substrate 14 can be, for example, a semiconductor substrate such as silicon, or the like. FIG. 2 shows an enlarged view of a portion of the MEMS device 10 illustrated in FIG. 1 and emphasized by box 18.

Referring to FIGS. 1 and 2, the movable mass 12 generally moves in a lateral sensing direction indicated by bi-directional motion axis arrow, which corresponds to the sensing axis or direction 16. The sensing direction 16 is substantially parallel to a centerline 17 of the movable mass 12. The movable mass 12 is supported at regular intervals by suspension structures 22. Anchors 24 mount the suspension structures 22 to the underlying substrate. Fixed sensing fingers 30, 32 are fixedly mounted on the substrate 14. Movable sensing fingers 20 form part of the movable mass 12 and move with the movable mass 12 relative to the substrate 14. The fixed sensing fingers 30, 32 and the movable sensing fingers 20 are substantially parallel to one another and provide a plurality of differential sensing capacitor pairs. A typical width, for example, of each of the fixed sensing fingers 30, 32 and the movable sensing fingers 20 is about 0.5 to 5.0 microns.

In this embodiment, the movable sensing fingers 20, the fixed sensing fingers 30, 32, the movable mass 12, and the suspension structures 22 are patterned from a single substantially conductive upper layer. As used herein "conductive" is intended to mean that either a material is a true conductor, such as a metal, or that the material has been doped or otherwise treated to improve its electrical conductivity, such as by doping a semiconductor material.

The "suspension structure" may include a "beam," "tether," "arm," or any other structure configured to perform a mechanical spring function and enable the movable mass 12 to move in response to acceleration or other stimulus along the sensing direction and return to its original position. The suspension structure 22 has a spring constant ($K_x$) along the sensing direction 16 that contributes to the sensitivity of the MEMS device 10.

In the illustrated exemplary embodiments of FIGS. 1-4, each suspension structure 22 is connected to the anchor 24 at a single point and to the movable mass 12 at two attachment points. The suspension structures 22 can be arranged, for example, in a serpentine pattern. The serpentine pattern of the suspension structures 22 can be formed by a plurality of segments joined together at elbows 34, 36.

Some portions of the suspension structure 22 that are separated by a relatively small gap, for example 0.5 to 5 microns, and that are generally symmetrical about a longitudinal axis of the suspension structure 22, tend to have the same movements when the MEMS device 10 is subject to stimulus along the sensing direction, for example, acceleration. In other words, some portions of the suspension structure 22 tend to move in tandem. The portions that move in tandem can be two portions that have the same displacement when subject to a stimulus and/or two portions that share a common motion when subject to a stimulus. As an example, the elbows 34, 36 can move in tandem when the MEMS device is subject to a stimulus.

Figure 3:
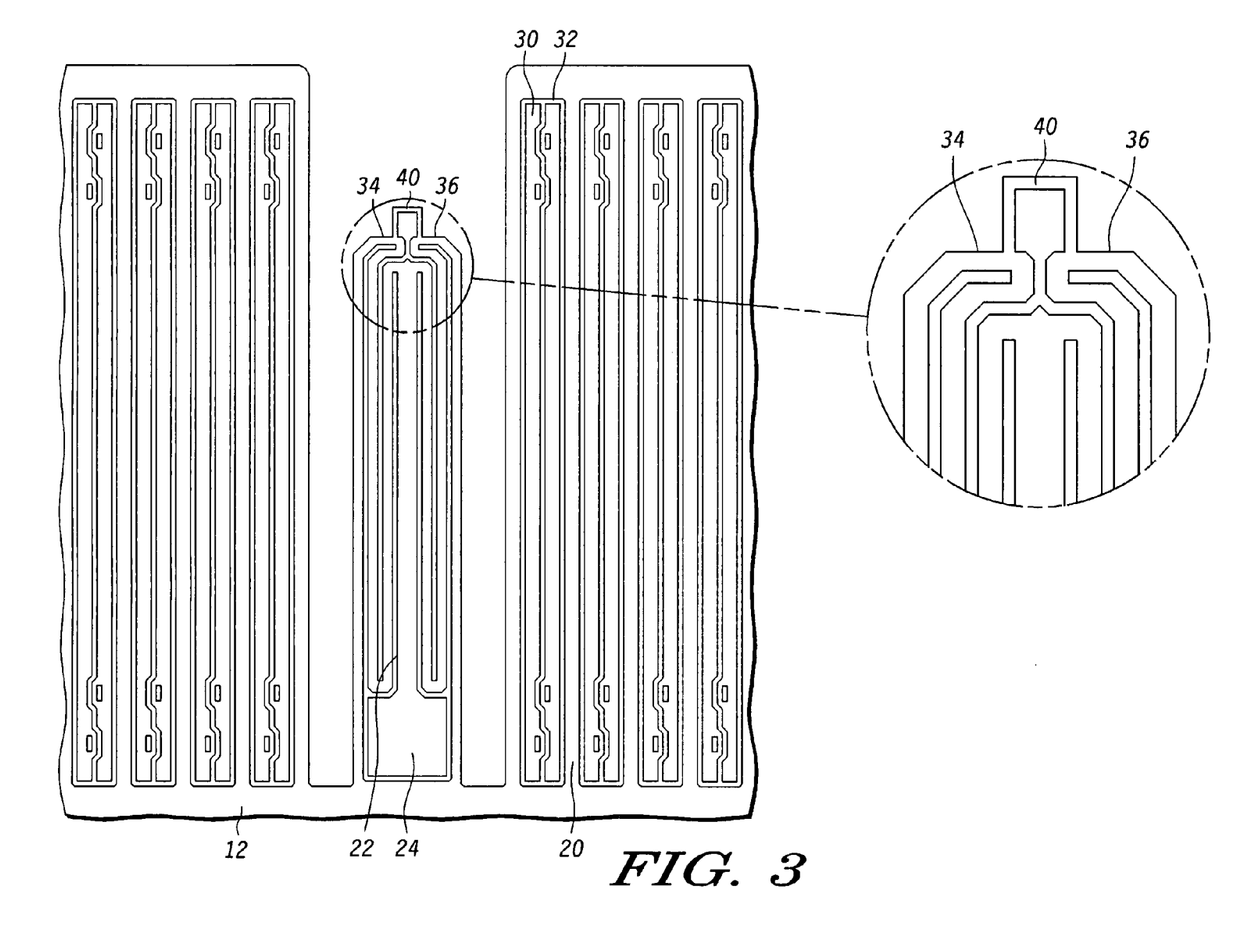
FIG. 3 illustrates a variation of the portion of the MEMS device shown in FIG. 2.
Figure 4:
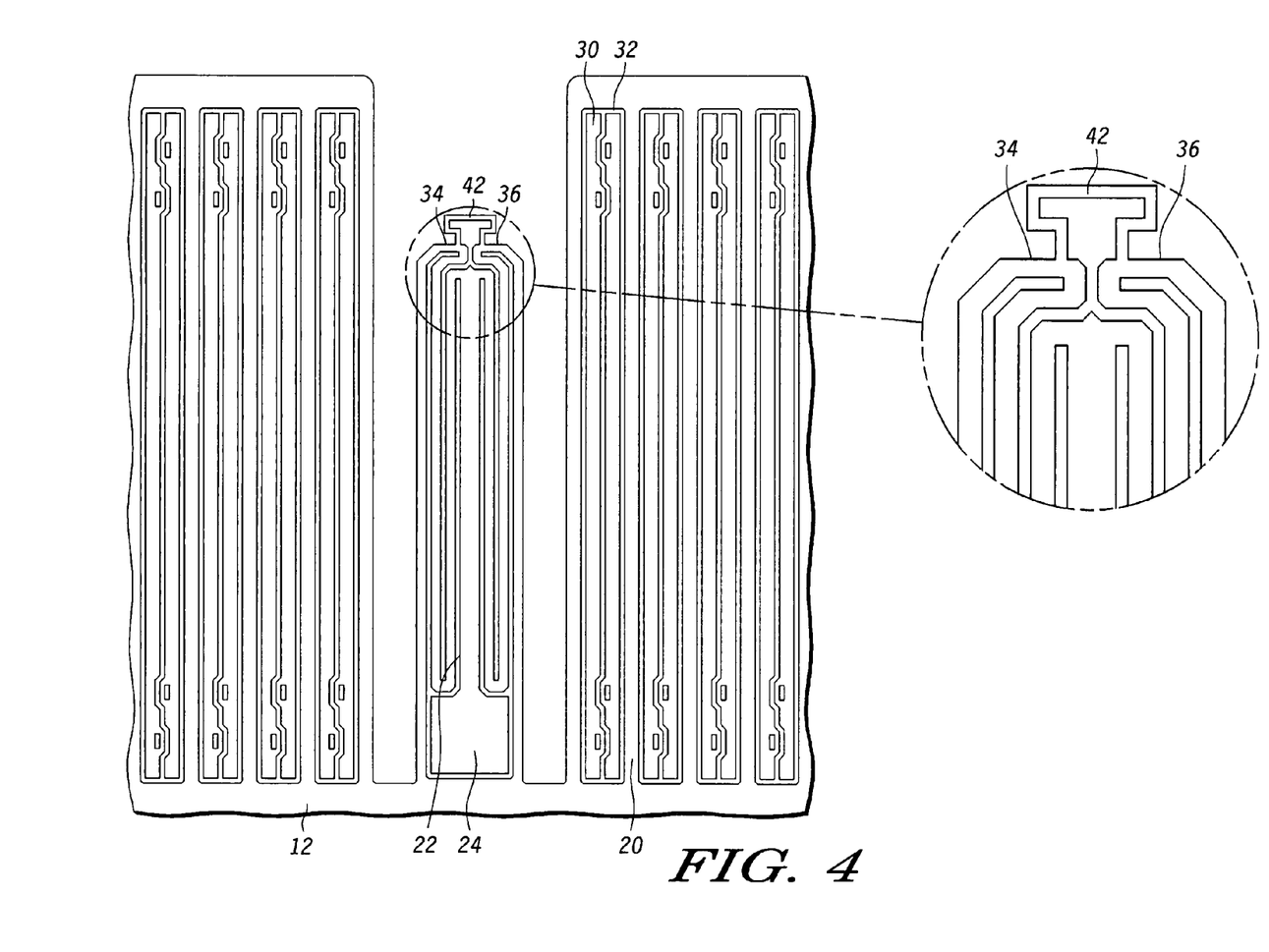
FIG. 4 illustrates another variation of the portion of the MEMS device shown in FIG. 2.

In accordance with one embodiment, at least some of the portions of the suspension structure 22 that tend to move in tandem can be connected by a link 38, 40, 42. The link 38, 40, 42 prevents the portions moving in tandem from sticking together by maintaining a separation. Accordingly, the link 38, 40, 42 prevents unintended stiction between the portions that move in tandem.

In the embodiment illustrated in FIG. 2, the link 38 is straight and links elbows 34, 36. As shown in an alternative embodiment illustrated in FIG. 3, a generally U-shaped link 40 with jogged portions can be provided to link elbows 34, 36. As shown in another embodiment illustrated in FIG. 4, a generally C-shaped link 42 with jogged portions can be provided to link elbows 34, 36. The U-shaped link 40 can have three segments joined at 90° angles. The C-shaped link 42 can have seven segments joined at 90° angles. A greater or fewer number of segments for the links 38, 40, 42 can be provided and the transitions between the segments that make up the links 38, 40, 42 can be curved or at angles other than 90°.

The link 38, 40, 42 can be integral with the suspension structure 22, or the link 38, 40, 42 can be a separate structure. Generally, the link 38, 40, 42 can be any shape or configuration that does not significantly affect the spring constant ($K_x$) of the suspension structure 22 along the sensing direction 16. Similarly, the link 38, 40, 42 can be provided at any portion or position on the suspension structure 22 that will not significantly affect the spring constant ($K_x$) of the suspension structure 22 along the sensing direction 16. In the illustrated embodiments, the sensing direction 16 is transverse to the longitudinal axis of the suspension structure 22 and is referred to as the transverse spring constant ($K_x$). The axial spring constant ($K_y$) is the spring constant of the suspension structure 22 along the longitudinal axis of the suspension structure 22. In one exemplary embodiment, the link 38, 40, 42 between portions of the suspension structure 22 increases the spring constant ($K_x$) along the sensing direction 16 by, for example, less than 10%, less than 5%, or less than 1%.

As noted above, the link 38, 40, 42 can connect any two portions of the MEMS device 10 that tend to move in tandem. For example, portions of the suspension structure other than the elbows 34, 36 can be linked. An elbow 34, 36 can be linked to a potion other than another one of the elbows 34, 36, or two portions that are not elbows 34, 36 can be linked to each other. Moreover, more than two portions can be linked together.

The link (e.g, link 38, 40, or 42) between portions of the suspension structure that move in tandem can also decrease stiction by increasing a restoring force on a movable element of the device, for example, a movable element of the suspension structure 22, by essentially combining the restoring forces of the linked portions. As an example, the restoring force of two portions of the suspension structure 22 can be increased by a factor of two if the two portions of the suspension structure 22 are linked. Generally, if n portions of the suspension structure 22 are linked, the restoring force is increased by approximately a factor of n. The increased restoring force makes it less likely that the linked portions will come into contact with neighboring portions of the MEMS device 10 since a greater stimulus is necessary to bring about the contact. The neighboring portion can be part of the same suspension structure 22 or a different part of the MEMS device 10. Linking the portions of the suspension structure 22 will also decrease the probability of stiction if the portions do contact by increasing the force acting to return the elements to their original configuration.

Figure 5:
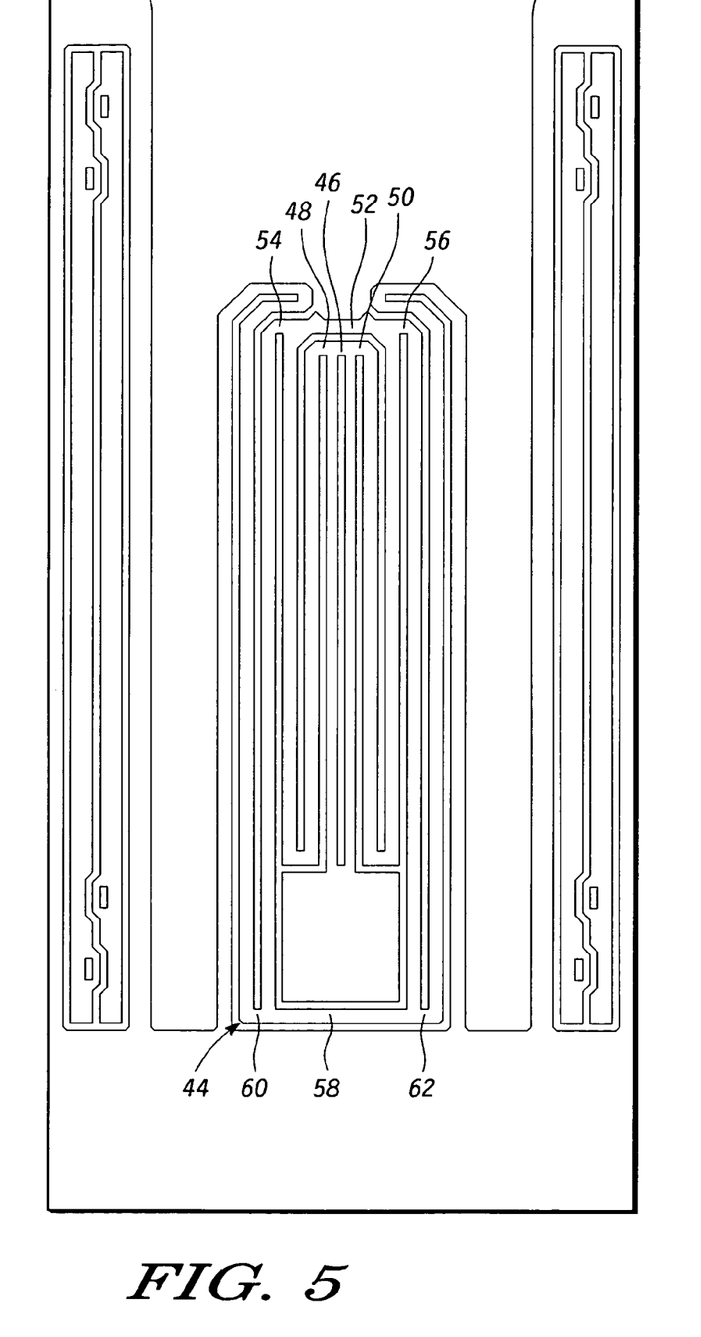
FIG. 5 illustrates yet another variation of the portion of the MEMS device shown in FIG. 2.

FIG. 5 illustrates an alternate embodiment of a MEMS device 10 having a suspension structure 44 that includes more than one link 46, 52, 58 that connects portions of the suspension structure 44 that move in tandem. The suspension structure 44 can include a first link 46 between elbows 48, 50; a second link 52 between elbows 54, 56; and a third link 58 between elbows 60, 62.

The MEMS device 10 can be fabricated using conventional techniques, except as discussed herein with respect to the novel aspects. In one embodiment, the substrate 14 can be provided. A sacrificial layer (not shown) is deposited over the substrate 14. If the substrate 14 is substantially conducting, an insulating layer such as silicon nitride or oxide plus nitride may be provided if needed to maintain electrical isolation of the overlying layer or to reduce parasitic capacitances. The sacrificial layer can comprise phosphorosilicate glass (PSG), but may comprise other sacrificial materials as are known in the art. A series of contact openings can then be formed in the sacrificial layer to define the positions of the anchors 24 and the fixed sensing fingers 30, 32. If the sacrificial layer is PSG, this may be accomplished by a suitable oxide etch that exhibits etch stop behavior at the substrate 14. A conductive material is deposited in the openings and overlying the sacrificial layer. The conductive material may comprise polysilicon, which may be suitably doped in some applications, but may also comprise other semiconductor materials or various metals. The conductive layer may be deposited through chemical vapor deposition (CVD) or by other suitable means as are known in the art. The conductive layer is then masked, patterned, and etched to define the movable mass 12; the suspension structures 22, 44; the anchors 24; the links 38, 40, 42, 46, 52, 58; and the fixed sensing fingers 30, 32. Release of the movable mass 12 and suspension structures 22, 44 is achieved through the use of a suitable etchant to remove the sacrificial layer. If the sacrificial layer is PSG, the etchant can be HF.

In one embodiment, the link between portions of the suspension structure that move in tandem is on the same layer as the suspension structure. However, in other embodiments, the link can be above or below the suspension structure.

In some embodiments, providing a link between portions of the suspension structure increases the axial spring constant ($K_y$) as compared to the spring constant of a suspension structure without the link. The axial spring constant ($K_y$) can be increased, for example, by a factor of three. The increase in the axial spring constant ($K_y$) resulting from the link can reduce stress tolerance of the suspension structure. The straight link 38 illustrated in FIGS. 1 and 2 may increase the axial spring constant ($K_y$) by a greater amount than the jogged links 40, 42 illustrated in FIGS. 3 and 4.

Quantitative tests suggest a tighter distribution of spring constants with the addition of one or more links between portions that tend to move in tandem. This tighter distribution is believed to be a result of a reduction in the occurrence of stiction within the MEMS device.

One embodiment has been described above with respect to an accelerometer. However, the embodiments can be used in other applications such as micromechanical relays, safing switches, angular rate sensors, and the like. Two sensing structures as described above can be positioned orthogonally on a single substrate to provide a two-axis (i.e. X-Y axis) accelerometer unit, or three sensing structures as described above can be positioned on multiple substrates to provide a three-axis accelerometer unit.

In accordance with one embodiment, a MEMS device includes a substrate; a movable mass suspended in proximity to the substrate; and at least one suspension structure coupled to the movable mass for performing a mechanical spring function. The at least one suspension structure has portions that move in tandem when the MEMS device is subject to a stimulus along at least one sensing direction, and the at least one suspension structure further includes at least one link between the portions that move in tandem.

The at least one suspension structure can have at least two segments that join to form a first elbow, and the at least one link can be provided approximately at the first elbow.

The at least one suspension structure can have at least two additional segments that join to form a second elbow, and the at least one link can be provided approximately between the first and second elbows.

The at least one link can be a plurality of links.

The suspension structure can include a plurality of segments that join to form at least six elbows, and the at least one link can include three links, each linking a pair of elbows.

The at least one link can be straight. The at least one link can be generally U-shaped, and the generally U-shaped link can be formed by three segments joined at 90° angles. The at least one link can be generally C-shaped, and the generally C-shaped link can be formed by seven segments joined at 90° angles.

The MEMS device can further comprise fixed electrodes supported by the substrate, and the movable mass and the fixed electrodes can form a plurality of differential capacitor pairs.

The at least one suspension structure can have an axial spring constant ($K_y$) along a longitudinal axis and a transverse spring constant ($K_x$) along a transverse axis and in the at least one sensing direction, and the at least one link may not significantly increase the transverse spring constant ($K_x$) of the at least one suspension structure.

The at least one link can be positioned on a common layer with the at least one suspension structure.

In accordance with another embodiment, a method is provided for reducing stiction in a MEMS device having a substrate, a movable mass suspended in proximity to the substrate, and at least one suspension structure coupled to the movable mass for performing a mechanical spring function and including portions that move in tandem when the MEMS device is subject to a stimulus along at least one sensing direction. The method includes providing at least one link between the portions that move in tandem.

The at least one suspension structure can have at least two segments that join to form a first elbow, and the providing step can include providing the at least one link approximately at the first elbow.

The at least one suspension structure can have at least two additional segments that join to form a second elbow, and the at least one link can be provided approximately between the first and second elbows.

The at least one link is straight, generally U-shaped, or generally C-shaped.

The MEMS device can further include fixed electrodes supported by the substrate, and the movable mass and the fixed electrodes can form a plurality of differential capacitor pairs.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A MEMS device, comprising:
    a substrate;
    a movable mass suspended in proximity to the substrate; and
    at least one suspension structure coupled to the movable mass for performing a mechanical spring function,
    wherein the at least one suspension structure has portions that move in tandem when the MEMS device is subject to a stimulus along at least one sensing direction, and wherein the at least one suspension structure further includes at least one link between the portions that move in tandem, wherein the at least one suspension structure has an axial spring constant ($K_y$) along a longitudinal axis and a transverse spring constant ($K_x$) along a transverse axis and in the at least one sensing direction, wherein the at least one link does not significantly increase the transverse spring constant ($K_x$) of the at least one suspension structure.

2. The MEMS device of claim 1, wherein the at least one suspension structure has at least two segments that join to form a first elbow, and wherein the at least one link is provided approximately at the first elbow.

3. The MEMS device of claim 2, wherein the at least one suspension structure has at least two additional segments that join to form a second elbow, and wherein the at least one link is provided approximately between the first and second elbows.

4. The MEMS device of claim 1, wherein the at least one link is a plurality of links.

5. The MEMS device of claim 1, wherein the suspension structure includes a plurality of segments that join to form at least six elbows, and wherein the at least one link includes three links, each linking a pair of elbows.

6. The MEMS device of claim 1, wherein the at least one link is straight.

7. The MEMS device of claim 1, wherein the at least one link is generally U-shaped.

8. The MEMS device of claim 7, wherein the generally U-shaped link is formed by three segments joined at 90° angles.

9. The MEMS device of claim 1, wherein the at least one link is generally C-shaped.

10. The MEMS device of claim 9, wherein the generally C-shaped link is formed by seven segments joined at 90° angles.

11. The MEMS device of claim 1, further comprising fixed electrodes supported by the substrate, wherein the movable mass and the fixed electrodes form a plurality of differential capacitor pairs.

12. The MEMS device of claim 1, wherein the at least one link is positioned on a common layer with the at least one suspension structure.

13. A method of reducing stiction in a MEMS device having a substrate, a movable mass suspended in proximity to the substrate, and at least one suspension structure coupled to the movable mass for performing a mechanical spring function and including portions that move in tandem when the MEMS device is subject to a stimulus along at least one sensing direction, wherein the at least one suspension structure has an axial spring constant ($K_y$) along a longitudinal axis and a transverse spring constant ($K_x$) along a transverse axis and in the at least one sensing direction, the method comprising:
    providing at least one link between the portions that move in tandem such that the at least one link does not significantly increase the transverse spring constant ($K_x$) of the at least one suspension structure.

14. The method of claim 13, wherein the at least one suspension structure has at least two segments that join to form a first elbow, and
   wherein the providing step includes providing the at least one link approximately at the first elbow.

15. The method of claim 14, wherein the at least one suspension structure has at least two additional segments that join to form a second elbow, and wherein the at least one link is provided approximately between the first and second elbows.

16. The method of claim 13, wherein the at least one link is straight.

17. The method of claim 13, wherein the at least one link is generally U-shaped.

18. The method of claim 13, wherein the at least one link is generally C-shaped.

19. The method of claim 13, wherein the MEMS device further includes fixed electrodes supported by the substrate, and wherein the movable mass and the fixed electrodes form a plurality of differential capacitor pairs.

20. A MEMS device, comprising:
   a substrate;
   a movable mass suspended in proximity to the substrate; and
   at least one suspension structure coupled to the movable mass for performing a mechanical spring function,
   wherein the at least one suspension structure has a first segment and a second segment that move in tandem when the MEMS device is subject to a stimulus along at least one sensing direction, the first and second segments exhibiting mirror symmetry relative to one another along a symmetry axis, and
   wherein the at least one suspension structure further includes at least one link, at least a portion of the at least one link lying on the symmetry axis between the first and second segments.

* * * * *

UNITED STATES PATENT AND TRADEMARK OFFICE
CERTIFICATE OF CORRECTION

| | | |
|---|---|---|
| PATENT NO. | : 7,628,072 B2 | Page 1 of 1 |
| APPLICATION NO. | : 11/489789 | |
| DATED | : December 8, 2009 | |
| INVENTOR(S) | : Koury, Jr. et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 702 days.

Signed and Sealed this

Second Day of November, 2010

David J. Kappos
*Director of the United States Patent and Trademark Office*